United States Patent
Chu et al.

(10) Patent No.: US 9,018,955 B2
(45) Date of Patent: Apr. 28, 2015

(54) SYSTEM AND METHOD FOR RECEIVING MAGNETIC RESONANCE (MR) SIGNALS WITH AN FET ELECTRICALLY BETWEEN PREAMPLIFIER TERMINALS

(75) Inventors: Dashen Chu, Waukesha, WI (US);
Robert Stormont, Hartland, WI (US);
Scott Lindsay, Waukesha, WI (US);
Ricardo Matias, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 985 days.

(21) Appl. No.: 13/163,440

(22) Filed: Jun. 17, 2011

(65) Prior Publication Data
US 2012/0319687 A1   Dec. 20, 2012

(51) Int. Cl.
*G01R 33/36* (2006.01)

(52) U.S. Cl.
CPC .......... *G01R 33/365* (2013.01); *G01R 33/3621* (2013.01)

(58) Field of Classification Search
USPC ........................ 324/300–322; 600/407–435; 382/128–131
See application file for complete search history.

(56) References Cited

U.S. PATENT DOCUMENTS

| | | | |
|---|---|---|---|
| 4,194,179 A * | 3/1980 | Malinouskas | 340/870.11 |
| 5,433,196 A * | 7/1995 | Fiat | 600/410 |
| 5,682,883 A * | 11/1997 | Fiat | 600/323 |
| 6,160,400 A * | 12/2000 | Friedrich et al. | 324/322 |
| 2012/0319687 A1* | 12/2012 | Chu et al. | 324/318 |
| 2013/0093425 A1* | 4/2013 | Chu et al. | 324/318 |

FOREIGN PATENT DOCUMENTS

| | | | |
|---|---|---|---|
| CN | 102866368 A | * | 1/2013 |
| DE | 102012105201 A1 | * | 12/2012 |
| GB | 2403361 A | * | 12/2004 |

OTHER PUBLICATIONS

P.B. Roemer, W.A. Edelstein, C.E.Hayes, S.P. Souza, and O.M. Mueller, "The NMR Phased Array" by Magnetic Resonance in Medicine 16,192-225 (1990).

* cited by examiner

*Primary Examiner* — Melissa Koval
*Assistant Examiner* — Tiffany Fetzner
(74) *Attorney, Agent, or Firm* — Dean Small; The Small Patent Law Group, LLC

(57) ABSTRACT

A preamplifier is provided for a radio frequency (RF) receiver coil in a magnetic resonance imaging (MRI) system. The preamplifier includes an amplifier configured to receive at least one magnetic resonance (MR) signal from the RF receiver coil and configured to generate an amplified MR signal. An input circuit is electrically connected to the amplifier. The input circuit is configured to be electrically connected to an output of the RF receiver coil for transmitting the at least one MR signal from the RF receiver coil to the amplifier. The input circuit includes an impedance transformer and a field effect transistor (FET). The FET is electrically connected between the impedance transformer and the amplifier. The FET has an FET impedance. The impedance transformer is configured to transform a source impedance of at least approximately 100 ohms. The impedance transformer is further configured to transform the FET impedance into a preamplifier input impedance of less than approximately 5 ohms.

20 Claims, 4 Drawing Sheets

SYSTEM AND METHOD FOR RECEIVING MAGNETIC RESONANCE (MR) SIGNALS WITH AN FET ELECTRICALLY BETWEEN PREAMPLIFIER TERMINALS

BACKGROUND OF THE INVENTION

The subject matter disclosed herein relates generally to magnetic resonance imaging (MRI) systems, and more particularly to systems and methods for receiving magnetic resonance (MR) signals from a subject.

MRI systems include a magnet, such as a superconducting magnet that generates a temporally constant (i.e., uniform and static) primary or main magnetic field. MRI data acquisition is accomplished by exciting magnetic moments within the primary magnetic field using magnetic gradient coils. For example, in order to image a region of interest, the magnetic gradient coils are energized to impose a magnetic gradient to the primary magnetic field. Radio-frequency (RF) transmit coils are then pulsed to create RF magnetic field pulses in a bore of an MRI scanner to selectively excite a volume corresponding to the region of interest in order to acquire MR images of the region of interest using a phased array of RF receiver coils. The resultant image that is generated shows the structure and function of the region of interest.

The RF receiver coils within the phased array may interact with each other via mutual inductive coupling caused by an induced current carried by each RF receiver coil in resonance. Such mutual inductive coupling between RF receiver coils may cause or increase cross-talk between RF receiver coils, which may cause artifacts within the resultant image. Mutual inductive coupling between RF receiver coils may also decrease the signal to noise ratio (SNR) of the RF receiver coils and/or the resultant image. Moreover, with parallel imaging in MRI, it has become desirable to increase the number of RF receiver coils within the phased array to provide phased arrays having higher channel counts. However, as the number of channels and/or RF receiver coils in the phased array increases, mutual inductive coupling between RF receiver coils may also increase. Such an increase in mutual inductive coupling may result in further SNR reduction and/or parallel imaging performance degradation, which may offset any benefits of the increased number of RF receiver coils and/or channels within the phased array.

BRIEF DESCRIPTION OF THE INVENTION

In accordance with various embodiments, a preamplifier is provided for a radio frequency (RF) receiver coil in a magnetic resonance imaging (MRI) system. The preamplifier includes an amplifier configured to receive at least one magnetic resonance (MR) signal from the RF receiver coil and configured to generate an amplified MR signal. An input circuit is electrically connected to the amplifier. The input circuit is configured to be electrically connected to an output of the RF receiver coil for transmitting the at least one MR signal from the RF receiver coil to the amplifier. The input circuit includes an impedance transformer and a field effect transistor (FET). The FET is electrically connected between the impedance transformer and the amplifier. The FET has an FET impedance. The impedance transformer is configured to transform a source impedance of at least approximately 100 ohms. The impedance transformer is further configured to transform the FET impedance into a preamplifier input impedance of less than approximately 5 ohms.

In accordance with other embodiments, a system is provided for receiving magnetic resonance (MR) signals emitted by a subject. The system includes a radio frequency (RF) receiver coil configured to detect the MR signals, a preamplifier configured to generate an amplified MR signal, and an impedance transformer electrically connected between the RF receiver coil and the preamplifier. The impedance transformer is configured to transform a coil impedance of the RF receiver coil into a source impedance of at least approximately 100 ohms.

In accordance with yet other embodiments, a method is provided for receiving magnetic resonance (MR) signals emitted by a subject. The method includes receiving at least one MR signal from a radio frequency (RF) receiver coil at an impedance transformer, transforming a coil impedance of the RF receiver coil to a source impedance of at least approximately 100 ohms using the impedance transformer, and amplifying the at least one MR signal using a pre-amplifier that is electrically connected to the impedance transformer.

DETAILED DESCRIPTION OF THE INVENTION

Figure 1:
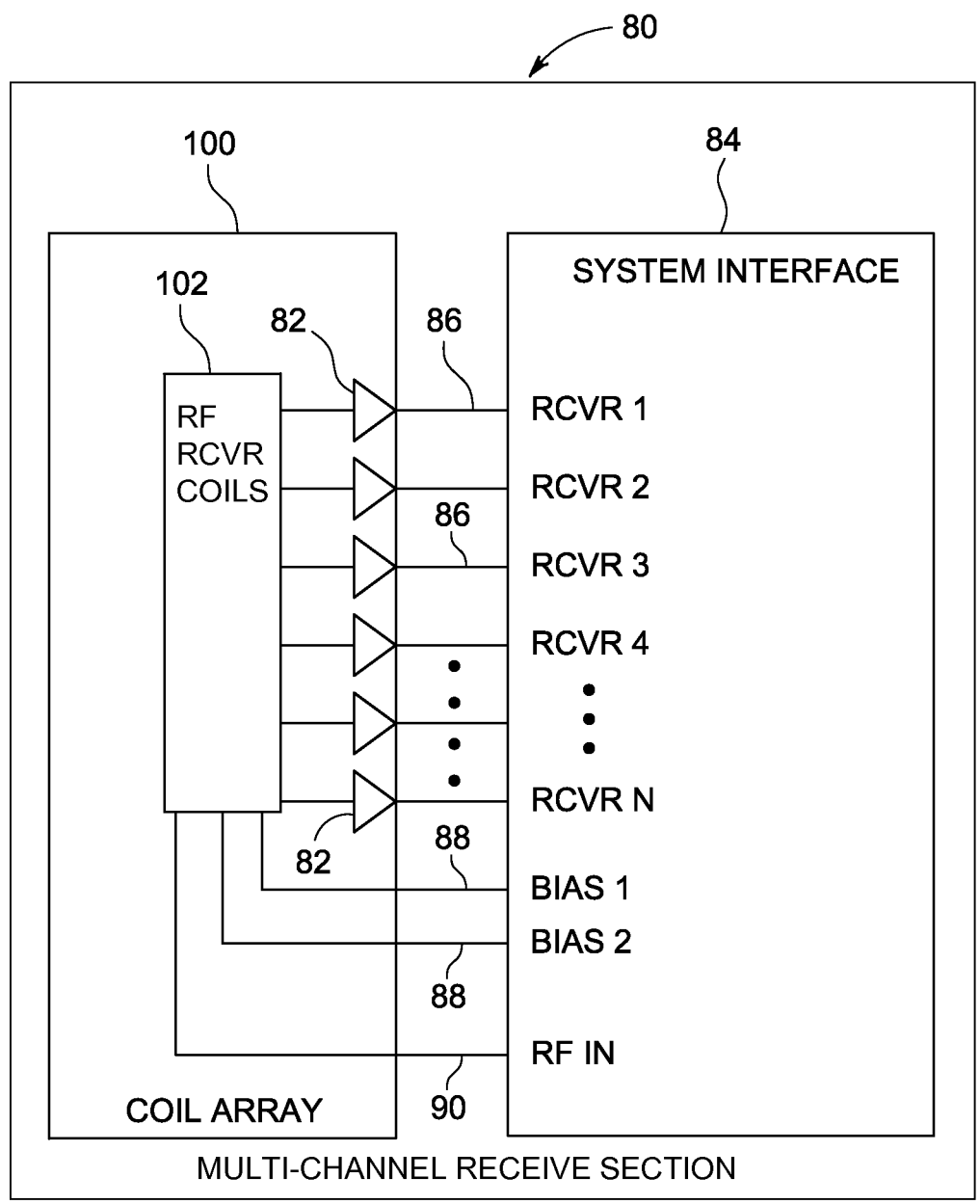
FIG. 1 is a block diagram of an embodiment of a receive section of a magnetic resonance imaging (MRI) system.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for receiving magnetic resonance (MR) signals, such as emitted by a subject, using a magnetic resonance imaging (MRI) system. By practicing at least one embodiment, a pre-amplifier is provided that accommodates a relatively high source impedance while having a relatively low input impedance.

Moreover, by practicing at least one embodiment, a higher blocking impedance may be provided as compared to MRI systems that use a conventional source impedance of approximately 50 ohms. At least one technical effect of various embodiments includes the reduction of radio frequency (RF) cross-talk between RF receiver coils within an array. At least one other technical effect of the various embodiments is an RF receiver coil having a higher signal to noise ratio (SNR).

As illustrated in FIG. 1, various embodiments may be implemented in connection with a receive section 80 of an MRI system. The receive section 80 is configured to acquire MR data using a coil array 100 that includes a plurality of radio frequency (RF) receiver coils 102 (illustrated as a single block element in FIG. 1 for simplicity). For example, the coil array 100 may include a plurality of loop elements that form the RF receiver coils 102. The RF receiver coils 102 are configured to detect MR signals. It should be noted that the RF receiver coils 102, for example adjacent loop elements, may be overlapped to reduce or minimize coupling. The RF receiver coils 102 are also isolated from each other using preamplifiers 82 that also amplify received MR signals from the RF receiver coils 102. In the exemplary embodiment, the coil array 100 is a dedicated receive only coil array. Alternatively, the coil array 100 is a switchable array, such as a switchable transmit/receive (T/R) phased array coil. Portions and/or an entirety of the receive section 80 may be referred to herein as a "system".

Thus, the coil array 100 forms part of the multi-channel receive section 80 connected to an MRI system. The receive section 80 includes a plurality of channels (Rcvr 1 . . . Rcvr N), for example, sixteen channels. However, it should be noted that more or less channels may be provided. In the exemplary embodiment, the coil array 100 is connected to the multi-channel receive section 80 having a multi-channel system interface 84 (e.g., a 1.5 T System Interface), with a separate receive channel 86 connected to each one of a plurality of the RF receiver coils 102 (e.g., sixteen channels connected to a four by four coil array).

The system interface 84 may include a plurality of bias control lines 88 (illustrated as two lines) to control the switching of decoupling circuits (not shown), which may be controlled, for example, using a coil configuration file stored in the MRI system and/or based on a user input. For example, based on a user input, a particular coil configuration file may be selected to control the coil array 100 configured as a T/R phased array coil in a particular imaging mode (e.g., user control of mode of operation using controls on an MRI scanner). An RF IN control line 90 also may be provided in connection with, for example, a combiner (not shown) to control a transmit coil array.

Figure 2:
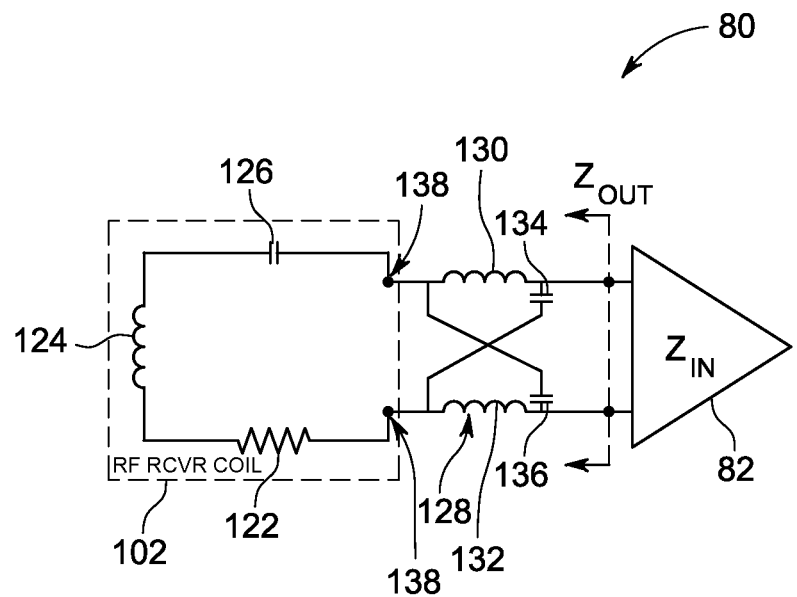
FIG. 2 is a schematic diagram of a portion of the receive section shown in FIG. 1 illustrating an embodiment of a radio frequency (RF) receiver coil and an embodiment of a corresponding pre-amplifier of the receive section.
Figure 3:
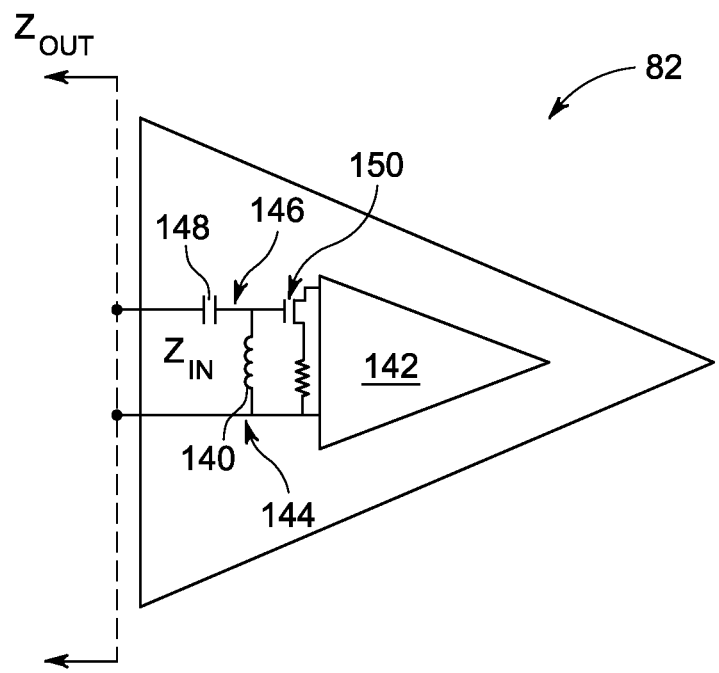
FIG. 3 is a schematic diagram illustrating an embodiment of the preamplifier shown in FIG. 2.

FIG. 2 is a schematic diagram of a portion of the receive section 80 illustrating an embodiment of one of the radio frequency (RF) receiver coils 102 and an embodiment of a corresponding pre-amplifier 82. In the exemplary embodiment, the preamplifier 82 has a relatively low input impedance. For example, in some embodiments, a "relatively low" input impedance of the preamplifier 82 is less than approximately 5 ohms at resonance frequency. The input impedance of the preamplifier 82 is defined by the inductor 140, which is shown in FIG. 3. In FIG. 2, the input impedance of the preamplifier is represented by $Z_{IN}$. In some embodiments, the preamplifier 82 has an input impedance of between approximately 1 ohm and approximately 3 ohms at resonance frequency. Moreover, in some embodiments, the preamplifier 82 has an input impedance of approximately 2 ohms at resonance frequency. It should be noted that for purposes of illustration, all of the capacitors are considered lossless and the inductors are represented with a series resistance. The input impedance of the preamplifier 82 may be referred to herein as a "preamplifier input impedance".

The RF receiver coil 102 includes an RLC resonant circuit formed from a resistor 122, an inductor 124, and a capacitor 126. The RF receiver coil 102 is also connected in series to an impedance transformer 128. More specifically, the impedance transformer 128 is electrically connected between the RF receiver coil 102 and the preamplifier 82. The impedance transformer 128 forms an impedance matching network between the RF receiver coil 102 and the preamplifier 82. The impedance transformer 128 is configured to transform a coil impedance of the RF receiver coil 102 into a source impedance of the preamplifier 82. The source impedance of the preamplifier 82 is represented in FIG. 2 by $Z_{OUT}$. The coil impedance of the RF receiver coil 102 may have any value, which may be dependant on coil loading, coil size, field strength, and/or the like. Examples of the coil impedance of the RF receiver coil 102 include, but are not limited to, between approximately 2 ohms and approximately 10 ohms at 1.5 T field strength, and/or the like.

In one exemplary embodiment, the impedance transformer 128 includes a lattice-type balun. More specifically, the impedance transformer 128 includes two inductors 130 and 132 and two capacitors 134 and 136. The inductor 130 is connected in series to the capacitor 134, while the inductor 132 is connected in series with the capacitor 136. The inductor 130 and the capacitor 134 are connected in parallel to the inductor 132 and the capacitor 136. In the exemplary embodiment, the arrangement of the lattice-type balun impedance transformer 128 produces a +/−90° phase shift. Each of the inductors 130 and 132 may be referred to herein as a "first" and/or a "second" inductor. The capacitors 134 and 136 may be referred to herein as a "first" and/or a "second" capacitor.

The impedance transformer 128 is configured to transform the coil impedance of the RF receiver coil 102 into a relatively high source impedance $Z_{OUT}$. For example, in some embodiments, a "relatively high" source impedance $Z_{OUT}$ is at least approximately 100 ohms. Accordingly, in the exemplary embodiment, the impedance transformer 128 is configured to transform the coil impedance of the RF receiver coil 102 into a source impedance $Z_{OUT}$ of at least approximately 100 ohms. In some embodiments, the impedance transformer 128 is configured to transform the coil impedance of the RF receiver coil 102 into a source impedance $Z_{OUT}$ of at least approximately 300 ohms, at least approximately 400 ohms, or at least approximately 500 ohms. Exemplary values for the inductors 130 and 132 include, but are not limited to, approximately 123.5 nH. Exemplary values for the capacitors 134 and 136 include, but are not limited to, approximately 51 pF.

The impedance transformer 128 also provides a blocking impedance to the RF receiver coil 102. Transformation of the coil impedance of the RF receiver coil 102 to a relative high source impedance $Z_{OUT}$ may enable the impedance transformer 128 to provide a higher blocking impedance to the RF receiver coil 102. Because the relatively high source impedance $Z_{OUT}$ of the preamplifier 82 is greater than, for example, the conventional value of approximately 50 ohms, the reactance X of the inductors 130 and 132 and the capacitors 134 and 136 of the impedance transformer 128 are increased. For example, the reactance $X_C$ of each of the capacitors 134 and 136 and the reactance $X_L$ of each of the inductors 130 and 132 can be defined by the equation: $X_C = X_L = \sqrt{(R_1 \times R_2)}$; where $R_1$ is the coil impedance and $R_2$ is the source impedance $Z_{OUT}$. Because the input impedance $Z_{IN}$ of the preamplifier 82 is relatively low, the impedance transformer 128 forms a parallel resonance circuit that results in a higher impedance at an output 138 of the RF receiver coil 102. As the reactances $X_C$ and $X_L$ increase, the blocking impedance increases because the blocking impedance is directly proportional to the values of $X_C$ and $X_L$. The higher blocking impedance suppresses an increased amount of RF current along the RF receiver coil 102, which may ultimately result in a higher SNR ratio because of fewer interactions between RF receiver coils 102 and/or less correlated noise. Exemplary values for such higher blocking impedances include, for example, a blocking impedance of at least 300 ohms, at least 500 ohms, and at least 1000 ohms.

The impedance transformer 128 is not limited to a lattice-type balun structure for transforming the coil impedance of the RF receiver coil 102 into a relatively high source impedance. Rather, any components and arrangement of the connections therebetween may be used to transform the coil impedance of the RF receiver coil 102 into a relatively high source impedance, such as, but not limited to, other types of equivalent phase shift baluns, and/or the like.

FIG. 3 is a schematic diagram illustrating an embodiment of the preamplifier 82 shown in FIG. 2. The preamplifier 82 is configured to accommodate the relatively high source impedance $Z_{OUT}$ while providing the relatively low input impedance $Z_{IN}$. The input impedance $Z_{IN}$ of the preamplifier 82 is defined by the inductor 140 of the preamplifier 82. The preamplifier 82 includes an amplifier 142 that receives MR signals from the corresponding RF receiver coil 102 (FIG. 2) and amplifies the received MR signals. An input circuit 144 is electrically connected to the amplifier 142. The input circuit 144 is electrically connected to the output 138 (FIG. 2) of the corresponding RF receiver coil 102, via the impedance transformer 128 (FIG. 2). The input circuit 144 is configured to transmit the MR signals from the corresponding RF receiver coil 102 to the amplifier 142.

The input circuit 144 includes an impedance transformer 146, which includes a capacitor 148 and the inductor 140. The input circuit 144 also includes a field effect transistor (FET) 150 that is electrically connected between the impedance transformer 146 and the amplifier 142, for example as shown in FIG. 3. The impedance transformer 146 is electrically connected between the amplifier 142 and the corresponding RF receiver coil 102.

In the exemplary embodiment, the FET 150 has a relatively large noise circle, which may be centered in the Smith Chart, for the FET 150 to yield a relatively low noise figure. In other words, the FET 150 is capable of providing a relatively low noise figure over a relatively broad range of source impedance $Z_{OUT}$. For example, in some embodiments, a "relatively large" size of the noise circle of the FET 150 is at least approximately 0.3 decibels. In some embodiments, the noise circle of the FET 150 has a size of at least approximately 0.6 decibels. The size of the noise circle of the FET 150 is dependent on the noise resistance $R_N$ of the FET 150. The FET 150 may have any value of noise resistance $R_N$ that provides a noise circle having a size of at least 0.3 decibels, such as, but not limited to, less than approximately 0.03 ohms, equal to or less than approximately 0.02 ohms, and/or the like. The location of the noise circle of the FET 150 within the Smith Chart is dependant on the optimum reflection coefficient of the FET 150. For example, the noise circle of the FET 150 may be located closer to the center of the Smith Chart (i.e., closer to being concentric) when the optimum reflection coefficient of the FET 150 is less than approximately 100 ohms. In some embodiments, the noise circle of the FET 150 is centered within the Smith Chart (i.e., concentric with the Smith Chart). In some embodiments, and for example, the FET 150 has an optimum reflection coefficient of less than approximately 100 ohms. In some embodiments, and for example, the FET 150 has an optimum reflection coefficient of between approximately 40 ohms and approximately 60 ohms, for example approximately 50 ohms.

Figure 4:
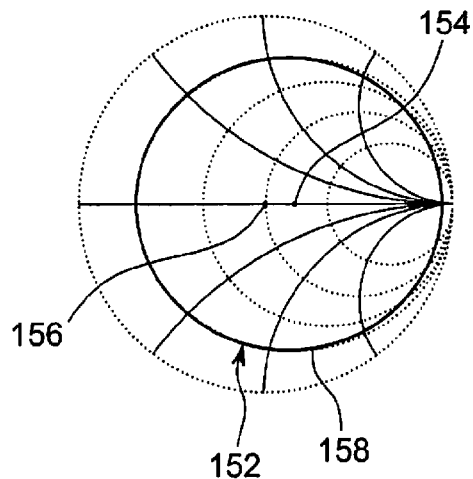
FIG. 4 is a graphical illustration of an embodiment of a Smith Chart for an embodiment of a field effect transistor (FET) of the preamplifier shown in FIGS. 2 and 3.

FIG. 4 is a graphical illustration of an embodiment of a Smith Chart for the FET 150 (FIG. 3). In the exemplary embodiment of FIG. 4, the FET 150 has noise resistance $R_N$ of approximately 0.02 ohms and an optimum reflection coefficient of approximately 50 ohms. A noise circle 152 of the FET 150 as shown in FIG. 4 has a size of approximately 0.6 decibels. As can be seen in FIG. 4, a center 154 of the noise circle 152 of the FET 150 is relatively close to a center 156 of the Smith Chart. By "relatively close" it is meant that the center 156 of the Smith Chart lies within the circumference 158 of the noise circle 152. In some alternative embodiments, the center 156 of the Smith Chart is aligned with the center 154 of the noise circle 152 such that the Smith Chart and the noise circle 152 are concentric.

Referring again to FIG. 3, the impedance transformer 146 is configured to transform the relatively high source impedance $Z_{OUT}$ provided by the impedance transformer 128 into an impedance that is within the noise circle (e.g., the noise circle 152 shown in FIG. 4) of the FET 150. In other words, the impedance transformer 146 is configured to transform a source impedance $Z_{OUT}$ of at least approximately 100 ohms into an impedance that is within the noise circle of the FET 150. For example, in some embodiments, the impedance transformer 146 is configured to transform a source impedance $Z_{OUT}$ of at least approximately 300 ohms, at least approximately 400 ohms, or at least approximately 500 ohms into an impedance that is within the noise circle of the FET 150. The relatively large noise circle of the FET 150 enables the impedance transformer 146 to form an LC series resonance while transforming the relatively high source impedance $Z_{OUT}$ into an impedance that is within the noise circle. The impedance within the noise circle that the impedance transformer 146 transforms the relatively high source impedance $Z_{OUT}$ into is selected for optimum noise matching, i.e., to yield a reduced or minimum noise figure, which may increase the SNR of the RF receiver coil 102.

The impedance transformer 146 is also configured to transform the impedance of the FET 150 into the relatively low input impedance $Z_{IN}$ of the preamplifier 82. In other words, the impedance transformer 146 is configured to transform the impedance of the FET 150 into an input impedance $Z_{IN}$ of less than approximately 5 ohms. For example, in some embodiments the impedance transformer 146 is configured to transform the impedance of the FET 150 into an input impedance $Z_{IN}$ of between approximately 1 ohm and approximately 3 ohms, for example approximately 2 ohms. The impedance of the FET 150 may have any value, such as, but not limited to, at least approximately 1,000 ohms, at least approximately 500,000 ohms, at least approximately 1,000,000 ohms, and/or the like. Exemplary values of the inductor 140 include, but are not limited to, approximately 4.4 pF. Exemplary values of the capacitor 148 include, but are not limited to, approximately 515 nH. The impedance of the FET 150 may be referred to herein as an "FET impedance".

Figure 5:
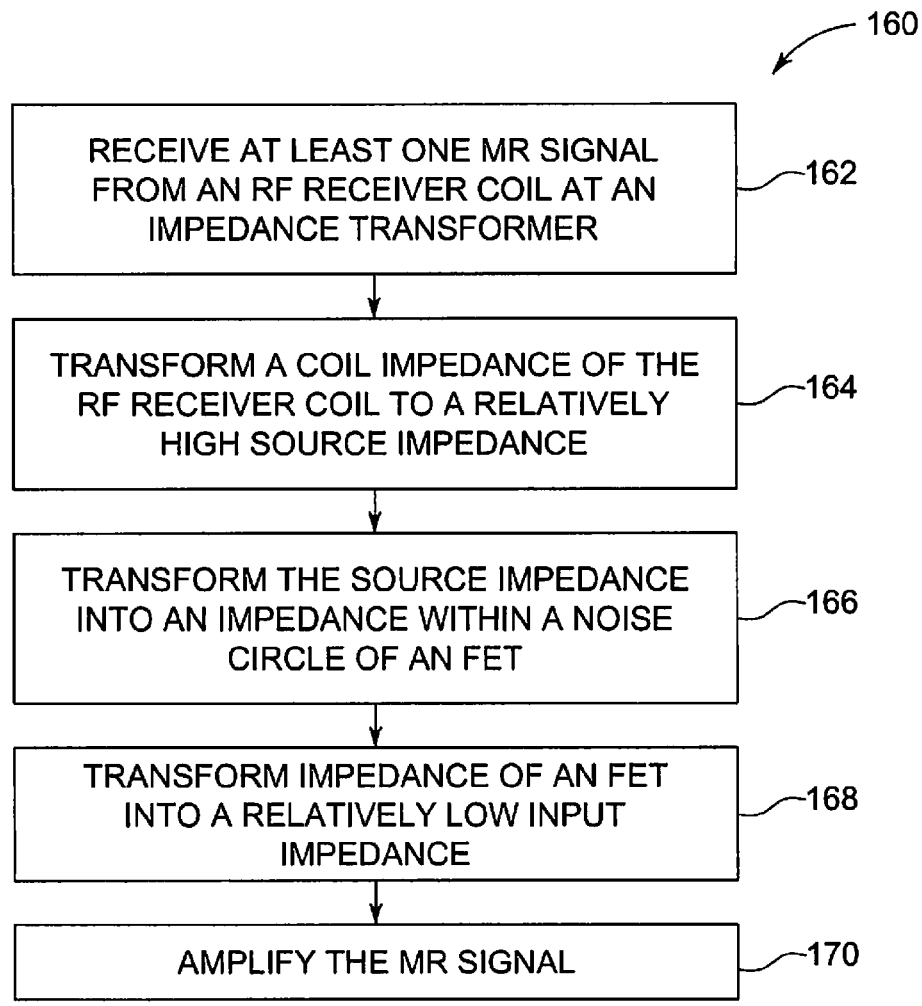
FIG. 5 is a flowchart illustrating an embodiment of a method for receiving magnetic resonance (MR) signals.

FIG. 5 is a flowchart illustrating an embodiment of a method 160 for receiving magnetic resonance (MR) signals, such as MR signals emitted by a subject. At 162, the method 160 includes receiving at least one MR signal from an RF receiver coil at an impedance transformer. For example, the MR signal may be received from the RF receiver coil 102 (FIG. 2) at the impedance transformer 128 (FIG. 2). At 164, the impedance transformer transforms a coil impedance of the RF receiver coil to a relatively high source impedance $Z_{OUT}$ (FIGS. 2 and 3) of at least approximately 100 ohms. For example, the impedance transformer 128 may be used to transform at 164 the coil impedance of the RF receiver coil 102 to the relatively high source impedance $Z_{OUT}$.

The source impedance $Z_{OUT}$ is transformed at 166 by a preamplifier (e.g., the preamplifier 82 shown in FIGS. 1-3) into an impedance that is within a noise circle of an FET (e.g., the FET 150 shown in FIG. 3) of the preamplifier. At 168, an impedance of the FET of the preamplifier is transformed by the preamplifier into a relatively low input impedance $Z_{IN}$ of the preamplifier of less than approximately 5 ohms. At 170, the method 160 further includes amplifying the MR signal using the pre-amplifier.

It should be noted that the various embodiments are not limited to a particular MRI system or a particular coil type or arrangement. Accordingly, the embodiments described and/or illustrated herein may be used with an MRI system having different power levels, channels, etc. and that have different receive surface coils operating at one or more frequencies. Moreover, the components included within the embodiments descried and/or illustrated herein and the value of each of the components may be varied as desired or needed.

Figure 6:
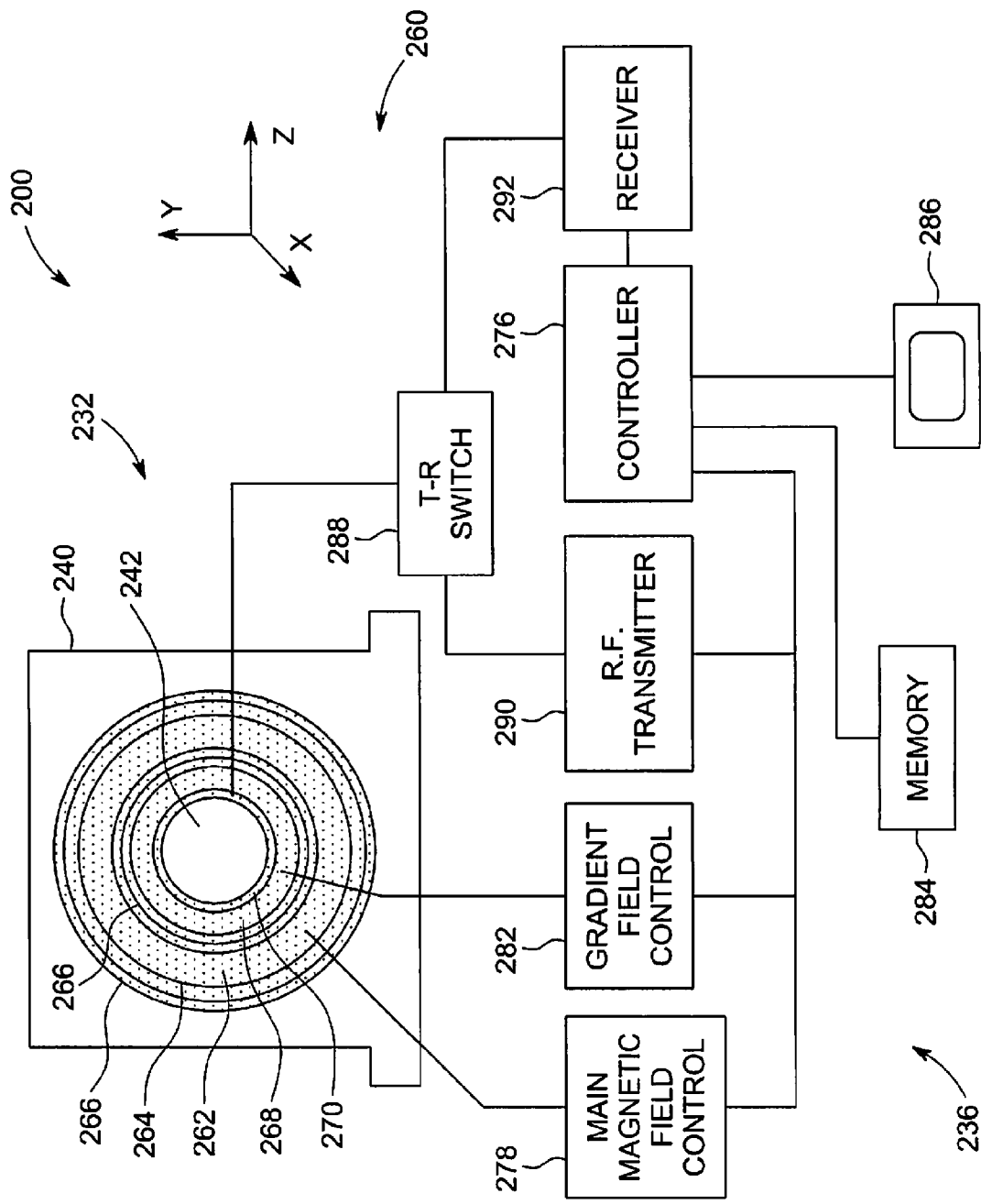
FIG. 6 is a block diagram of an MRI system in which a pre-amplifier formed in accordance with various embodiments may be implemented.

The various embodiments described and/or illustrated herein may be implemented, for example, with MR coils for use with the MRI system 200 shown in FIG. 6. It should be appreciated that although the imaging system 200 is illustrated as a single modality imaging system, the various embodiments may be implemented in or with multi-modality imaging systems. The imaging system 200 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Referring to FIG. 6, the MRI system 200 generally includes an imaging portion 232 and a processing portion 236 that may include a processor or other computing or controller device. The MRI system 200 includes within a gantry 240 a superconducting magnet 262 formed from magnetic coils supported on a magnet coil support structure. However, in other embodiments, different types of magnets may be used, such as permanent magnets or electromagnets. A vessel 264 (also referred to as a cryostat) surrounds the superconducting magnet 262 and is filled with liquid helium to cool the coils of the superconducting magnet 262. Thermal insulation 266 is provided surrounding the outer surface of the vessel 264 and the inner surface of the superconducting magnet 262. A plurality of magnetic gradient coils 268 are provided within the superconducting magnet 262 and an RF transmit coil 270 is provided within the plurality of magnetic gradient coils 268. In some embodiments the RF transmit coil 270 may be replaced with a transmit and receive coil as described in more detail herein. The components within the gantry 240 generally form the imaging portion 232. It should be noted that although the superconducting magnet 262 is a cylindrical shaped, other shapes of magnets can be used.

The processing portion 236 generally includes a controller 256, a main magnetic field control 278, a gradient field control 282, a memory 284, a display device 286, a transmit-receive (T-R) switch 288, an RF transmitter 290 and a receiver 292.

In operation, a body of an object, such as a patient or a phantom to be imaged, is placed in the bore 242 on a suitable support, for example, a patient table. The superconducting magnet 262 produces a uniform and static main magnetic field $B_o$ across the bore 242. The strength of the electromagnetic field in the bore 242 and correspondingly in the patient, is controlled by the controller 276 via the main magnetic field control 278, which also controls a supply of energizing current to the superconducting magnet 262.

The magnetic gradient coils 268, which include one or more gradient coil elements, are provided so that a magnetic gradient can be imposed on the magnetic field $B_o$ in the bore 242 within the superconducting magnet 262 in any one or more of three orthogonal directions x, y, and z. The magnetic gradient coils 268 are energized by the gradient field control 282 and are also controlled by the controller 276.

The RF transmit coil 270, which may include a plurality of coils, is arranged to transmit magnetic pulses and/or optionally simultaneously detect MR signals from the patient if receive coil elements are also provided, such as a surface coil configured as an RF receiver coil. The RF receiver coil (e.g., the RF receiver coil 102 shown in FIGS. 1 and 2) may be of any type or configuration, for example, a separate receiver surface coil, and includes the impedance transformer 128 and preamplifiers 82 as described and illustrated in more detail herein. Moreover the system interface 84 (shown in FIG. 1) may form part of, for example, the controller 276, T-R switch 288 or receiver 292, which with the coil array may form the receive section 80.

The RF transmit coil 270 may be a body coil, such as a birdcage type coil. The receive surface coil may be an array of RF coils provided within the RF transmit coil 270. The RF transmit coil 270 is detuned or decoupled from the receive surface coil(s) as described herein. Thus, the RF transmit coil 270 configured as a body part specific coil (e.g., torso coil), may be combined with the receive surface coil.

The RF transmit coil 270 and the receiver surface coil are selectably interconnected to one of the RF transmitter 290 or receiver 292, respectively, by the T-R switch 288. The RF transmitter 290 and T-R switch 288 are controlled by the controller 276 such that RF field pulses or signals are generated by the RF transmitter 290 and selectively applied to the patient for excitation of magnetic resonance in the patient. While the RF excitation pulses are being applied to the patient, the T-R switch 288 is also actuated to disconnect the receive surface coil from the receiver 292.

Following application of the RF pulses, the T-R switch 288 is again actuated to disconnect the RF transmit coil 270 from the RF transmitter 290 and to connect the receiver surface coil to the receiver 292. The receiver surface coil operates to detect or sense the MR signals resulting from the excited nuclei in the patient and communicates the MR signals to the receiver 292, which may be communicated to multiple channels as described in more detail herein. These detected MR signals are in turn communicated to the controller 276. The controller 276 includes a processor (e.g., image reconstruction processor), for example, that controls the processing of the MR signals to produce signals representative of an image of the patient.

The processed signals representative of the image are also transmitted to the display device 286 to provide a visual display of the image. Specifically, the MR signals fill or form a k-space that is Fourier transformed to obtain a viewable image. The processed signals representative of the image are then transmitted to the display device 186.

The various embodiments of the pre-amplifiers accommodate a relatively high source impedance while providing a relatively low input impedance. The various embodiments may provide higher blocking impedance than MRI systems that use a conventional source impedance of approximately 50 ohms. The various embodiments of the RF receiver coils may have a higher SNR. Because decoupling impedance can be directly translated to the reduction of induced RF current in a resonant loop, improvement of pre-amplifier decoupling efficiency may result in the reduction of RF cross-talk between RF receiver coils within an array. The reduction of the cross-talk between RF receiver coils may reduce the mutual interactions between the RF receiver coils, and may also lead to an effective way to further improve fundamental RF coil designs, including more condensed coil geometry, for more intrinsic SNR and/or improved parallel imaging performance in MRI. For example, it may not be necessary to follow the rule of 10% to 15%. The higher pre-amplifier blocking provided by the various embodiments may enable the simplification of RF receiver coil designs and/or may lead to the reduction or removal of isolation circuits between RF receiver coils without compromising performance of an RF receiver coil array, which may result in reductions or elimination of isolation adjustment during manufacturing. The various embodiments may reduce the cost of manufacturing RF receiver coils, preamplifiers, MRI receive sections, and/or MRI systems overall.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a floppy disk drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A preamplifier configured for a radio frequency (RF) receiver coil in a magnetic resonance imaging (MRI) system, the preamplifier comprising:
   an amplifier configured to receive at least one magnetic resonance (MR) signal from the RF receiver coil and configured to generate an amplified MR signal; and
   an input circuit electrically connected to the amplifier, the input circuit being configured to be electrically connected to an output of the RF receiver coil and configured for transmitting the at least one MR signal from the RF receiver coil to the amplifier, the input circuit comprising:
      an impedance transformer; and a field effect transistor (FET), with the FET being electrically connected between terminals of the preamplifier, the FET also being electrically connected between the impedance transformer and the amplifier, with the FET having an FET impedance, and the impedance transformer being configured to transform a source impedance of at least approximately 100 ohms, the impedance transformer also being further configured to transform the FET impedance into a preamplifier input impedance of less than approximately 5 ohms.

2. The preamplifier of claim 1, wherein the impedance transformer is configured to transform the source impedance into an impedance that is within a noise circle of the FET.

3. The preamplifier of claim 1, wherein the impedance transformer is configured to transform a source impedance of at least 300 ohms.

4. The preamplifier of claim 1, wherein the impedance transformer is configured to transform the FET impedance into a preamplifier input impedance of between approximately 1 ohm and approximately 3 ohms.

5. The preamplifier of claim 1, wherein the impedance transformer is configured to transform an FET impedance of at least 500,000 ohms into the preamplifier input impedance.

6. The preamplifier of claim 1, wherein the impedance transformer is configured to transform the source impedance into an impedance that is within a noise circle of the FET, the noise circle of the FET having a size of at least 0.3 decibels.

7. The preamplifier of claim 1, wherein the impedance transformer is configured to transform the FET impedance into a preamplifier input impedance of approximately 2 ohms.

8. The preamplifier of claim 1, wherein the FET has an optimum reflection coefficient of less than 100 ohms.

9. The preamplifier of claim 1, wherein the impedance transformer is electrically connected between the RF receiver coil and the amplifier and is also configured to transform a coil impedance of the RF receiver coil into a source impedance of the amplifier.

10. A system configured for receiving magnetic resonance (MR) signals emitted by a subject, the system comprising:
    a radio frequency (RF) receiver coil configured to detect the MR signals;
    a preamplifier configured to generate an amplified MR signal;
    an impedance transformer electrically connected between the RF receiver coil and the preamplifier, wherein the impedance transformer is configured to transform a coil impedance of the RF receiver coil into a source impedance of at least approximately 100 ohms; and
    a field effect transistor (FET) electrically connected between terminals of the preamplifier, with the FET also being electrically connected between the impedance transformer and the preamplifier, and the FET having an FET impedance.

11. The system of claim 10, wherein the impedance transformer comprises a lattice-type balun.

12. The system of claim 10, wherein the impedance transformer is configured to transform the coil impedance to a source impedance of at least 300 ohms.

13. The system of claim 10, wherein the impedance transformer is connected in series with the RF receiver coil.

14. The system of claim 10, wherein the impedance transformer is configured to transform a coil impedance of between approximately 2 ohms and approximately 10 ohms into the source impedance.

15. A system configured for receiving magnetic resonance (MR) signals emitted by a subject, the system comprising:
    a radio frequency (RF) receiver coil configured to detect the MR signals;
    a preamplifier configured to generate an amplified MR signal;
    an impedance transformer electrically connected between the RF receiver coil and the preamplifier, wherein the impedance transformer is configured to transform a coil impedance of the RF receiver coil into a source impedance of at least 100 ohms, wherein the impedance transformer comprises first and second inductors and first and second capacitors, the first inductor being connected to the first capacitor in series, the second inductor being connected to the second capacitor in series, the first inductor and first capacitor also being connected to the second inductor and the second capacitor in parallel; and
    a field effect transistor (FET) electrically connected between terminals of the preamplifier, with the FET also being electrically connected between the impedance transformer and the preamplifier, and the FET having an FET impedance.

16. A method for receiving magnetic resonance (MR) signals emitted by a subject, the method comprising:
    receiving at least one MR signal from a radio frequency (RF) receiver coil at an impedance transformer;
    transforming a coil impedance of the RF receiver coil to a source impedance of at least 100 ohms using the impedance transformer;
    electrically connecting a field effect transistor (FET) between terminals of the preamplifier and electrically connecting the FET between the impedance transformer and a preamplifier, the FET having an FET impedance; and
    amplifying the at least one MR signal using the pre-amplifier that is electrically connected to the impedance transformer.

17. The method of claim 16, wherein transforming a coil impedance of the RF receiver coil comprises transforming the coil impedance into a source impedance of at least 300 ohms.

18. The method of claim 16, wherein transforming a coil impedance of the RF receiver coil comprises transforming the coil impedance using a lattice-type balun.

19. The method of claim 16, further comprising transforming the source impedance, using the pre-amplifier, into an impedance that is within a noise circle of the FET the impedance having a size of at least 0.3 decibels.

20. The method of claim 16, further comprising transforming an FET impedance of the FET a preamplifier input impedance of less than 5 ohms using the pre-amplifier.

* * * * *